United States Patent
Fischer et al.

(10) Patent No.: US 10,578,694 B2
(45) Date of Patent: Mar. 3, 2020

(54) SYSTEM AND METHOD FOR IMPROVED SIGNAL DETECTION IN NMR SPECTROSCOPY

(71) Applicant: Bruker BioSpin GmbH, Rheinstetten (DE)

(72) Inventors: Christian Fischer, Rheinstetten (DE); Markus Lang, Hombrechtikon (CH); Martin Wyser, Affoltern a/A (CH); Klaus Peter Neidig, Ettlingen (DE); Michael Erich Wilhelm Fey, Andover, MA (US)

(73) Assignee: Bruker BioSpin GmbH, Rheinstetten (DE)

( * ) Notice: Subject to any disclaimer, the term of this patent is extended or adjusted under 35 U.S.C. 154(b) by 0 days.

(21) Appl. No.: 16/444,519

(22) Filed: Jun. 18, 2019

(65) Prior Publication Data
US 2019/0391219 A1 Dec. 26, 2019

(30) Foreign Application Priority Data
Jun. 26, 2018 (EP) .................................... 18179985

(51) Int. Cl.
*G01R 33/46* (2006.01)
*G01R 33/54* (2006.01)

(52) U.S. Cl.
CPC ....... *G01R 33/4625* (2013.01); *G01R 33/543* (2013.01)

(58) Field of Classification Search
CPC ........................... G01R 33/4625; G01R 33/543
See application file for complete search history.

(56) References Cited

U.S. PATENT DOCUMENTS 5,121,337 A * 6/1992 Brown ................. G01N 21/274
                                                                250/339.12
6,027,941 A * 2/2000 Jarvie ................ G01R 33/4625
                                                                324/309

(Continued)

OTHER PUBLICATIONS

Bao et. al.: "A robust automatic phase correction method for signal dense spectra", J. Mag. Res. 234 (2013) pp. 82-89.

(Continued)

*Primary Examiner* — Dixomara Vargas
(74) *Attorney, Agent, or Firm* — Brake Hughes Bellermann LLP

(57) ABSTRACT

Systems and methods for improved NMR signal detection are described. The system receives NMR signal data produced by a sample over time in response to an excitation pulse and selects a predefined system function for application to the NMR signal data for systematic variation of signal properties The system function has a different influence on NMR signal components than on noise components of the sampled signal and has a variation parameter to control the systematic variation. A plurality of variation parameter values is provided with differing values to influence broad NMR signals as well as weak NMR signals. The system generates for each variation parameter value a corresponding intermediate data set by applying the system function with the respective variation parameter value to the NMR signal data. Further, from each intermediate data set, a respective base value centered spectrum is generated in the frequency-domain.

20 Claims, 11 Drawing Sheets

(56) References Cited

U.S. PATENT DOCUMENTS

| | | | |
|---|---|---|---|
| 8,248,071 B2* | 8/2012 | Szyperski | G01R 33/4633 |
| | | | 324/307 |
| 9,655,593 B2* | 5/2017 | Kawashima | G01S 7/52033 |
| 2005/0225323 A1* | 10/2005 | Cunningham | G01R 33/446 |
| | | | 324/307 |
| 2009/0230959 A1* | 9/2009 | Szyperski | G01N 24/087 |
| | | | 324/309 |
| 2010/0315083 A1* | 12/2010 | Pauli | G01N 24/08 |
| | | | 324/309 |
| 2013/0043867 A1* | 2/2013 | Corum | G01R 33/4616 |
| | | | 324/309 |
| 2015/0362571 A1* | 12/2015 | Le Fur | G01N 24/08 |
| | | | 324/309 |
| 2016/0278743 A1* | 9/2016 | Kawashima | G01S 7/52033 |
| 2017/0052238 A1* | 2/2017 | Le Fur | G01R 33/465 |
| 2017/0105649 A1* | 4/2017 | Peacock, III | G01R 33/4625 |
| 2019/0175051 A1* | 6/2019 | Peacock, III | G01R 33/4625 |
| 2019/0307393 A1* | 10/2019 | Lotz | G01R 33/5608 |

OTHER PUBLICATIONS

Jia et al.; "An Automatic Baseline Extraction Algorithm for Intensity Absorption Type Gas Sensing"; Journal of Lightwave Technology, vol. 31, No. 22, Nov. 15, 2013; pp. 3582-3587.

Jia et al.; "Salient Space Detection Algorithm for Signal Extraction From Contaminated and Distorted Spectrum"; The Analyst, vol. 143, No. 11, May 14, 2018; pp. 2656-2664.

European Search Report for Application No. 18179985.9, dated Feb. 5, 2019, 3 pages.

\* cited by examiner

SYSTEM AND METHOD FOR IMPROVED SIGNAL DETECTION IN NMR SPECTROSCOPY

CROSS REFERENCE TO RELATED APPLICATION

This application claims the benefit of priority based on European Application No. EP18179985.9, filed on Jun. 26, 2018 and entitled "SYSTEM AND METHOD FOR IMPROVED SIGNAL DETECTION IN NMR SPECTROSCOPY" the entirety of which is hereby incorporated by reference.

TECHNICAL FIELD

The subject matter described herein generally relates to signal detection in NMR spectroscopy and more particularly to improved signal detection based on systematic variation of signal properties.

BACKGROUND

Nuclear magnetic resonance (NMR) spectroscopy is a spectroscopic technique to observe local magnetic fields around atomic nuclei. A sample is placed in a magnetic field and the NMR signal is produced by excitation of the nuclei sample with radio frequency (RF) pulses into nuclear magnetic resonance, which is detected with sensitive RF receivers. The intramolecular magnetic field around an atom in a molecule changes the resonance frequency, thus giving access to details of the electronic structure of a molecule and its individual functional groups. For example, NMR spectroscopy is used to identify monomolecular organic compounds, proteins and other complex molecules. Besides identification, NMR spectroscopy provides detailed information about the structure, dynamics, reaction state, and chemical environment of molecules. Common types of NMR include proton and carbon-13 NMR spectroscopy, just to name a few examples.

Upon excitation of the sample with a radio frequency (typically 60-1000 MHz) pulse, a nuclear magnetic resonance response is obtained which is referred to as free induction decay (FID) herein. The FID is typically a weak signal and may require sensitive RF receivers to detect such signals. A Fourier transform can be applied to extract the frequency-domain spectrum from the raw time-domain FID. A spectrum from a single FID typically has a low signal-to-noise ratio. Decay times of the excitation, typically measured in seconds, depend on the effectiveness of relaxation, which is faster for lighter nuclei and in solids, and slower for heavier nuclei and in solutions whereas they can be very long in gases.

Some existing NMR signal detection methods are based on computing the derivation of the frequency spectrum in a first step. As a consequence, broad signals (i.e., signals extending over a relatively large frequency interval in the frequency domain) get lost, whereas narrow signals are preserved. Further the derivation generates artefacts which can lead to false positives and false negatives. Such disadvantages can be partially remedied with the Continuous Wavelet Transformation, for example.

SUMMARY

There is therefore a need to provide systems and methods for robust signal detection where all relevant signals in a NMR signal data set can be detected with a high probability, independent of their signal intensity and signal width (i.e., the width of respective signal peaks).

Embodiments of the claimed subject matter in the form of a computer-implemented method, computer system and computer program product solve this technical problem using the claimed features.

In one embodiment, a computer-implemented spectroscopic method for improved NMR signal detection is provided. The computer-implemented method can be executed by a computer system which can process a respective computer program product. The computer system has an interface to receive NMR signal data produced by a sample over time in response to an excitation pulse. Typically, the excitation pulse is an RF-pulse and the response of the sample, the free induction decay FID, is an exponentially falling, weak radio signal which typically ceases within about two seconds after the excitation pulse. When transforming this signal from the time-domain into the frequency domain (Fourier transformation), the resulting frequency spectrum shows multiple signal peaks at different frequencies which are indicative of certain nuclear cores (e.g., $^1$H, $^{13}$C, $^{15}$N, etc.). The amplitude of such peaks can be small and difficult to distinguish from noise components of the signal. At the same time the width of some peaks can be quite broad (extending over a relatively large frequency range).

To better distinguish real NMR signal components from noise components, the claimed approach uses a predefined system function and applies the system function to the NMR signal data for systematic variation of signal properties. Thereby, the NMR signal data may be the originally sampled data in the time-domain or the data may already be transformed into the frequency-domain. The system function can be selected from a group of possible system functions suitable for the respective domain. For example, there are system functions which are applicable to the raw time-domain data (the data directly obtained from the measurement) whereas other system functions can be applied to the corresponding frequency spectrum. Appropriate system functions include but are not limited to: convolution in the Frequency domain using a Lorentz function, Gaussian function or Trapezium function, and multiplication in the time domain using an exponential decay function, exponential slope function or trigonometric function. For example, using multiplication of NMR signal data in the time domain with an exponential decay function is advantageous with regards to the computational efficiency of the system. In the time domain, the noise components dominate at a later delay than the signal components. So multiplication of the raw data in the time domain with an exponential decay function results in a higher amplification of the signal components than of the noise components.

For the claimed approach, the system function may be applied in the time-domain or in the frequency-domain as long as an appropriate system function is selected for the respective domain. The selected system function is adapted to have a different influence on NMR signal components than on noise components of the sampled signal. Further, the system function has a variation parameter which allows to control the systematic variation of the signal properties. In other words, applying the system function with multiple different variation parameter values to the NMR signal data (either in the time of frequency domain) allows to produce multiple variation versions of the NMR signal data. In other words, when applying the system function with the respective variation parameter values to the sampled NMR signal data a corresponding intermediate data set is generated for each variation parameter value. In practice, about 3 to about 20 variation parameters can be used. Advantageously, 5 to 10 variations parameter values may be used.

It can be advantageous to use a variation parameter with Hertz as the unit of measurement. The variation parameter values may be provided as predefined parameters which are of the order of the half-width of signal peaks in the frequency-domain of the received NMR data set. That is, the parameter values are defined in such a way that each relevant peak of the spectrum (in the frequency-domain) is influenced by at least one of the variation parameter values. The variation parameter values may be predefined based on the experience gained from previous measurements. Advantageously, the differing values of the variation parameter values can be selected to influence, in the frequency-domain, NMR signals with a signal intensity within a given interval around the mean signal intensity of the sampled signal, and NMR signals with a signal width within a given interval around the mean signal width. Such variation parameter values ensure that sharp signals with low signal intensity as well as broad signals will be substantially affected by the application of the system function which will finally allow to detect such signals with high certainty. Affecting a signal substantially when applying the system function means that the different variation parameter values lead to a significant variation (e.g., variance) of the processed signal values in the respective intermediate data sets. In one embodiment, the system can automatically analyze the peaks in the frequency spectrum of the received NMR data set. The system can then automatically determine appropriate parameter values based on the height and width of the observed peaks in accordance with the above selection criteria.

It is to be noted that certain system functions are adapted to be applied in the time-domain, whereas other system functions are adapted to be applied in the frequency domain. With the implementation of certain system functions, such as, for example, the exponential decay function, the application of the system function in the time-domain leads to a computationally efficient embodiment.

The computer system then generates from each intermediate data set a respective base value centered spectrum in the frequency-domain. In case the intermediate sets were generated in the time-domain a Fourier transformation can be used to transform the intermediated data sets into the frequency domain. In case the intermediate data sets were already generated in the frequency-domain no such transformation is necessary at this stage. For generating the base value centered spectra the computer system computes for each frequency point of the intermediate data sets in the frequency-domain an ensemble base value based on the respective values of all intermediate data sets. That is, the ensemble base value at a particular frequency point may be formed, for example, as the arithmetic mean of the respective intermediate data set values at the particular frequency point. Other mean values or statistical methods may be used to compute an appropriate base value, including but not limited to geometric mean, harmonic mean, quadratic mean, median value, etc. For each frequency the respective computed ensemble base value is then subtracted from the respective values of the intermediate data sets resulting in the corresponding base value centered spectrum for each intermediate data set. That is, if N variation parameter values were used for the system function N base value centered spectra will result from this step. In other words, the base value centered spectra eliminate offsets from the intermediate data sets. This includes approximating corresponding base values representing the actual offsets.

In the following steps, the system distinguishes the NMR signal components from the noise components which are included in the received raw signal data. This is achieved by extracting from the base value centered spectra for each frequency point variations induced by the system function and identifying frequency intervals with significant variation as signal intervals.

In one embodiment, the system generates a (single) deviation spectrum (e.g., a standard deviation spectrum) from the plurality of generated base value centered spectra. The deviation spectrum includes frequency intervals which include peaks resulting from variations induced by the system function, and further includes frequency intervals with noise components only. For determining a noise value, the system selects a non-signal (frequency) interval in the deviation spectrum. A non-signal interval can easily be determined by looking at a particular frequency interval which does not show any peaks and analyzing whether the signal in the particular frequency interval shows a normal distribution and therefore qualifies as a mere noise signal with no NMR signal components included. A weighted noise value may then be determined for non-signal intervals in the deviation spectrum.

In one embodiment, a noise value can then be determined by computing the mean value and the standard deviation for the selected non-signal frequency interval in the deviation spectrum. The computed standard deviation can then be multiplied with a predefined weighting factor resulting in a weighted noise value. The weighting factor is selected so that a threshold probability is determined for values in the deviation spectrum which ensures that values being lower than or equal to the weighted noise value to qualify as noise values with said threshold probability. For example, multiplying the computed standard deviation with a weighting factor of 3.5 implies a 99 percent probability that all values beneath the weighted noise value are mere noise components of the signal and do not include any NMR signal components.

In an alternative embodiment, iterative thresholding may be used to determine the weighted noise values. Iterative thresholding algorithms are well-known by the skilled person as technique for determining noise values.

Frequency intervals with significant variations are then identified as signal intervals.

In the embodiment using the deviation spectrum, this is achieved by determining values in the deviation spectrum which are higher than the weighted noise value as NMR signal components. In other words, those parts of the base value centered spectra significant variations induced by the system function for different variation parameter values indicate frequency intervals with NMR signal components. They can be easily extracted as the peaks exceeding the weighted noise level in the deviation spectrum. In other words, a significant variation is present when a peak in the deviation spectrum exceeds the weighted noise level.

In an alternative embodiment for detecting the signal intervals, instead of using the deviation spectrum, the system generates an eigenspace matrix from the plurality of generated base value centered spectra to extract the induced variations. For example, the eigenspace matrix can include a row for each base value centered spectrum where each column includes the spectrum values for the respective frequency points. The relevant eigenvalues are determined by a threshold. For example, a relative threshold of a value of $10^{-5}$ may be used, i.e., all eigenvalues above the maximum eigenvalue multiplied with the threshold are used. Then, the absolute values of the product of the first m (with m=1; 2; 3; . . . ) eigenvectors and eigenvalues of the matrix are used. The absolute values represent the variations induced by the system function. If more than one eigenvector result is used, the resulting eigenvectors are summed up. In some cases, the absolute values of the first eigenvector of the matrix may already be sufficient and no summation is required. The eigenvector result is similar to the deviation spectrum where the absolute values of the at least first eigenvector (or the respective sum of eigenvectors) represent the system function induced variations.

Based on the eigenvector result, weighted noise values can be determined by using the same methodologies as disclosed in the deviation spectrum embodiment. The absolute values of the eigenvector result are then compared with the respective weighted noise values and NMR signal components are identified for such frequency points where the absolute values are greater than the weighted noise values.

In further embodiments, a computer program product when loaded into a memory of a computer system and executed by at least one processor of the computer system causes the computer system to execute the steps of the herein disclosed computer implemented method for functions of the computer system as disclosed herein.

The computer system for improved NMR signal detection in NMR spectroscopy can be summarized as a system having an interface module to receive NMR signal data produced by a sample over time in response to an excitation pulse.

An intermediate data set generator of the system selects a predefined system function for application to the sampled NMR signal data for systematic variation of signal properties. The system function has a different influence on NMR signal components than on noise components of the sampled signal. Further, the system function has a variation parameter to control the systematic variation. Thereby, different variation parameter values result in different variations when applying the system function to sampled NMR signal data.

A plurality of variation parameter values is provided to the system (either predefined or determined by the system) wherein the selected parameter values have differing values which are adapted for influencing the sampled NMR signals in the frequency-domain. Thereby, the influence extends to NMR signals with a signal intensity within a given interval around the mean signal intensity of the sampled signal, and NMR signals with a signal width within a given interval around the mean signal width. In other words, the variation parameter values are selected in a way that the system function affects every signal component in the sampled NMR signal data in at least one variation parameter setting.

The intermediate data set generator (IDSG) then generates for each variation parameter value a corresponding intermediate data set by applying the system function with the respective variation parameter value to the sampled NMR signal data.

The system further has a base value centered spectrum (BVCS) generator to generate from each intermediate data set, in the frequency-domain, a respective base value centered spectrum. In case the intermediated data sets are in the time-domain, the BVCS generator may include a time-domain-to-frequency-domain transformer. This may be implemented as a Fourier-Transformation to convert time-domain data into frequency-domain data before BVCS generation. The resulting base valued spectra have reduced offsets and include peaks and noise around a zero base line.

The system further has a signal detector to generate a deviation spectrum from the plurality of generated base value centered spectra. The deviation spectrum shows significant variations for frequency points where NMR signal components were affected by the system function. For frequency points without NMR signal components only the noise components are present. In such non-signal (frequency) intervals in the deviation spectrum the signal detector determines a weighted noise value for the deviation spectrum. Any peak of the deviation spectrum exceeding the weighted signal noise value corresponds to a sampled NMR signal component with a probability associated with the weighted noise value.

A signal-noise comparator of the signal detector detects signal intervals by extracting from the base value centered spectra for each frequency point variations induced by the system function. The frequency intervals with significant variations are identified identify as signal intervals. As discussed above, the signal-noise comparator may work on the basis of the deviation spectrum or it may use the eigenvector determination method as disclosed herein.

Further aspects of the claimed subject matter will be realized and attained by means of the elements and combinations particularly depicted in the appended claims. It is to be understood that both, the foregoing general description and the following detailed description are exemplary and explanatory only and are not restrictive of the invention as described.

DETAILED DESCRIPTION

Figure 1:
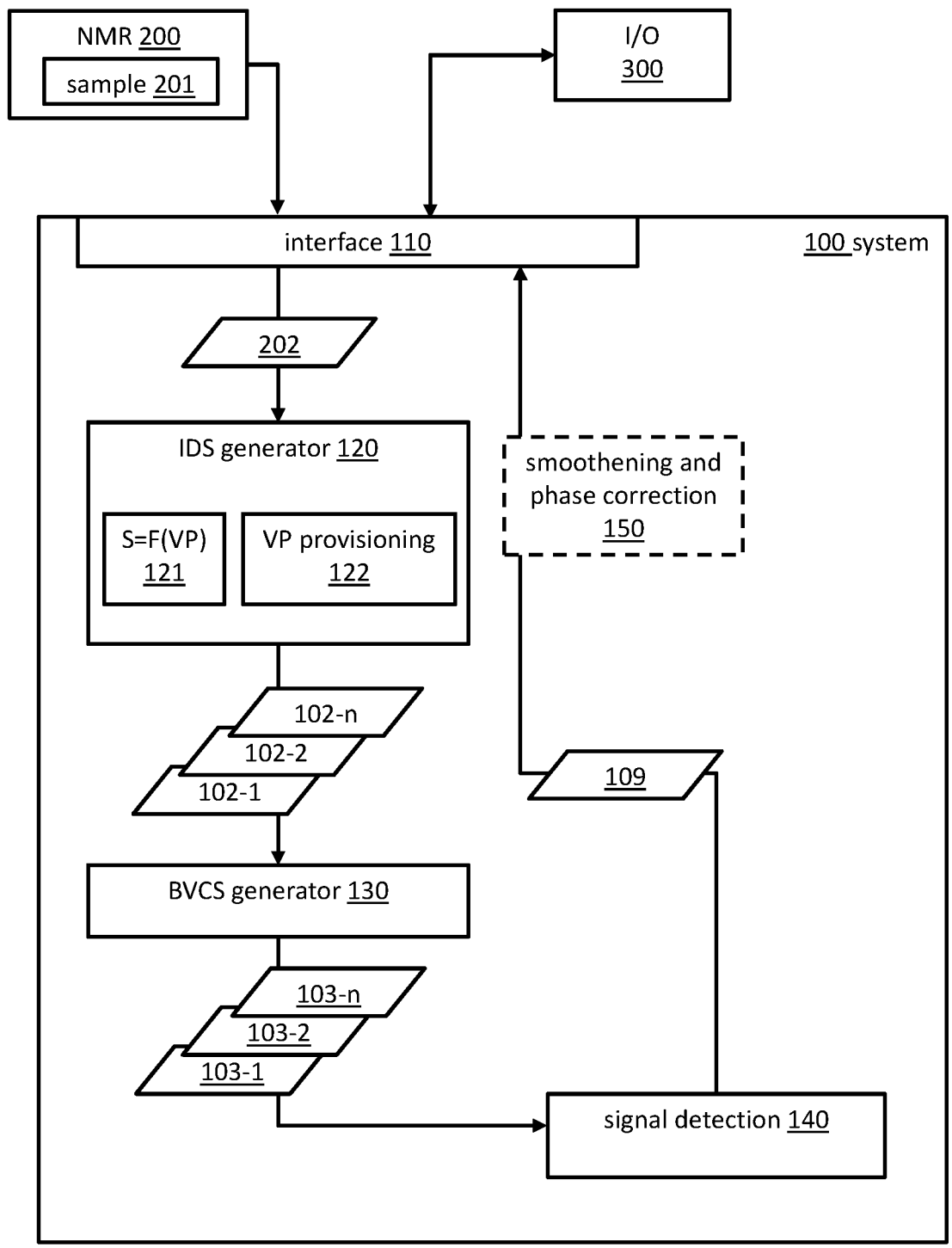
FIG. 1 is a block diagram of a computer system for improved NMR signal detection in NMR spectroscopy according to an embodiment.
Figure 2:
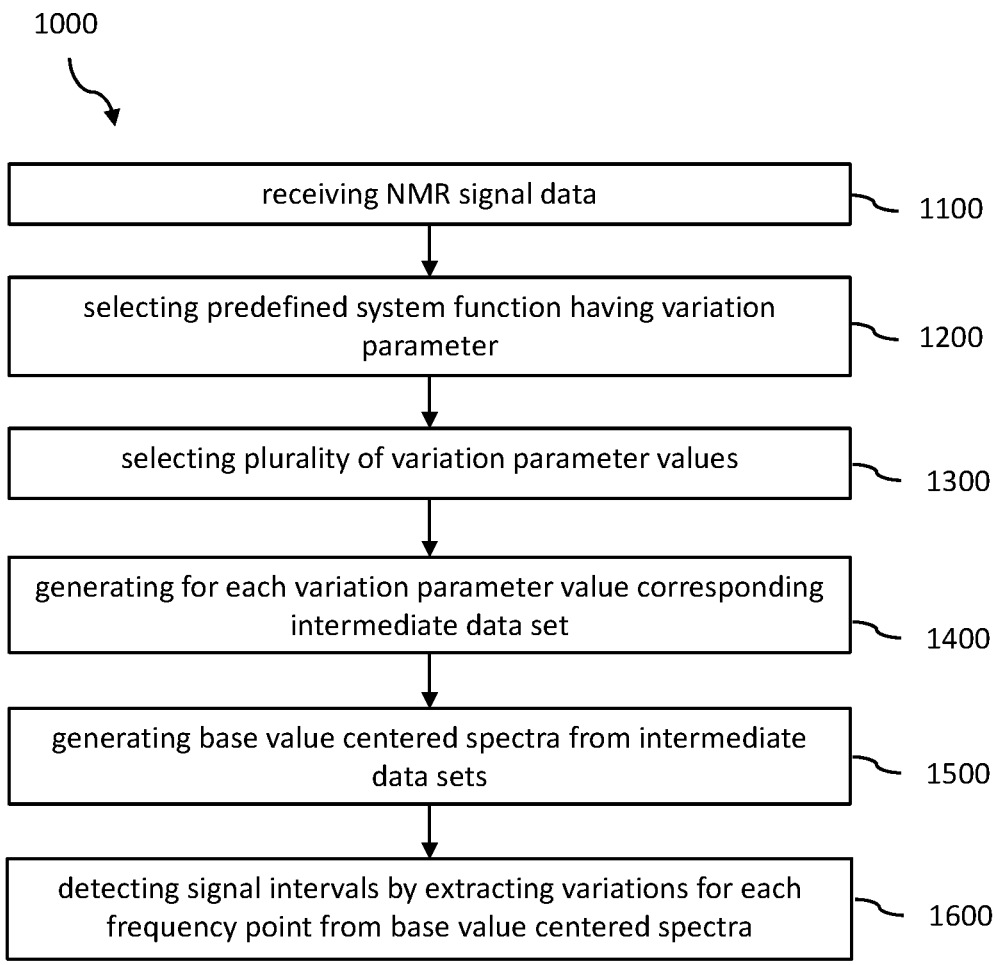
FIG. 2 is a simplified flow chart of a computer-implemented spectroscopic method for improved NMR signal detection according to an embodiment.

FIG. 1 is a block diagram of a computer system 100 for improved NMR signal detection in NMR spectroscopy according to an embodiment. The system 100 of FIG. 1 is described in the context of the simplified flow chart of a computer-implemented spectroscopic method 1000 for improved NMR signal detection as illustrated in FIG. 2. Therefore, the following description refers to reference numbers used in FIG. 1 and FIG. 2. The system 100 is thereby configured to execute the method 1000 when loading a respective computer program into a memory of the system and executing said program with processing means of the system.

The computer system 100 includes an interface module 110 for communicative coupling of the system 100 to a NMR system 200 for performing NMR measurements on a sample 201. Further, the interface 110 may be coupled with an Input/Output (I/O) unit 300 which allows a human user to interact with the computer system 100. Via the interface 110, the system receives 1100 NMR signal data 202 produced by the sample 201 over time in response to an excitation pulse. Such measurements techniques are well known in the art. The received signal data 202 may be in the time-domain or in the frequency-domain dependent on the data pre-processing functions of the NMR system 200. The original raw data captured by the NMR system 200 are in the time-domain measuring the signal decay over time. However, appropriate data pre-processing means of the NMR system 200 may already provide a frequency spectrum based on the captured data. It is to be noted that, form a conceptual perspective, it is irrelevant whether the received signal data 202 is in the time- or frequency-domain as data in each domain can be transformed into data of the other domain without any information loss.

The received NMR signal data 202 forms input to an intermediate data set generator (IDSG) 120. The IDSG 120 can access one or more predefined system functions 121. The system function(s) may be stored by the computer system or can be at least accessed by the system on a remote storage. A particular predefined system function 121 can be applied to the sampled NMR signal data 202 for systematic variation of signal properties. Thereby, the system function 121 has a different influence on NMR signal components than on noise components of the sampled signal. Further, the system function has a variation parameter (VP) 122 to control the systematic variation. In other words, a system function (when applied to the received NMR signal data 202 using multiple varying variation parameters) will affect the original signal data which include only noise components in a different way than it affects parts of the signal data which include NMR signal components.

The IDSG 120 selects 1200 a system function which is appropriate for the domain in which the NMR signal data 202 is received. If the received data 202 is in the time-domain, the system function can be advantageously selected from one or more of the following group of functions: exponential decay function, exponential slope function, or a trigonometric function (e.g., sinus or cosine function). However, other system functions may also be used which are appropriate for signal data in the time-domain. This signal function is applied to the received signal data by multiplying the system function with the NMR signal data 202. If the received signal data is in the frequency domain the system function can be advantageously selected from the following group of functions: Lorentz function, Gaussian function, or Trapezium Function. The system function is then used in a convolution with the NMR signal data 202.

For the variation of the system function a VP provisioning module 122 provides a plurality of variation parameter values. The parameter values selected for the variation have differing values covering an appropriate value range. The selected VP values are adapted for influencing the signal data 202 when represented in the frequency-domain so that NMR signals are affected which have a signal intensity within a given interval around the mean signal intensity of the sampled signal data 202, and which have signal width within a given interval around the mean signal width. That is, the VP values are selected 1300 to ensure that narrow signals with lower intensity may similarly be affected as broad signals with higher intensity. This is achieved by using a range of VP values so that each NMR signal component is affected by at least one of the selected VP values when applying the system function accordingly. The VP values may be automatically determined by the computer system based on such criteria or they may be provided by user of the computer system via the I/O unit 300. Advantageously, the variation parameter of the system function has Hertz as the unit of measurement and the number of variation parameter values is in the range from 3 to 20. Preferably, the number of VP values is in the range from 5 to 10.

The IDSG 120 then generates 1400 for each selected variation parameter value a corresponding intermediate data set 102-1 to 102-$n$ by applying the system function 121 with the respective variation parameter value to the sampled NMR signal data 202. If the number of selected VP values is n this results inn intermediate data sets 102-1 to 102-$n$. Each intermediate data set shows different values for such sampled data points where NMR signal components are present.

A base value centered spectrum (BVCS) generator 130 of the computer system 100 generates 1500 from each intermediate data set 102-1 to 102-$n$, in the frequency-domain, a respective mean base value centered spectrum 103-1 to 103-$n$. As this step is performed in the frequency domain, a transformation of the intermediate data sets into the frequency-domain occurs in case the system function was applied in the time-domain, for example by using Fourier Transformation. The respective base value centered spectra eliminate offsets from the intermediate data sets. This is achieved by approximating corresponding base values representing the actual offsets and deducting the approximated offsets from the intermediate data set values.

For generating the base value centered spectra the BVCS generator 130 computes for each frequency point of the intermediate data sets in the frequency-domain an ensemble base value based on the respective values of all intermediate data sets. That is, the ensemble base value at a particular frequency point may be formed, for example, as the arithmetic mean of the respective intermediate data sets values at the particular frequency point. Other mean values or statistical methods may be used to compute an appropriate base value, including but not limited to geometric mean, harmonic mean, quadratic mean, median value, etc. For each frequency the respective computed ensemble base value is then subtracted from the respective values of the intermediate data sets resulting in the corresponding base value centered spectrum for each intermediate data set. If n variation parameter values were used for signal variation through the system function n base value centered spectra result from this step.

The generated base value centered spectra serve as input to a signal detector 140 of the computer system 100. The signal detector 140 detects 1600 signal intervals 109 by extracting from the base value centered spectra 103-1 to 103-$n$ for each frequency point variations induced by the system function. The detector 140 finally identifies frequency intervals showing significant variations as signal intervals. The signal detector may be implemented by various embodiments.

In a first embodiment, the signal detector 140 extracts the variations from the base value centered spectra 103-1 to 103-$n$ by firstly generating a deviation spectrum from the plurality of generated base value centered spectra 103-1 to 103-$n$. That is, for each frequency point the standard deviation is computed taking into account the respective values of all generated base value centered spectra.

Then, a noise value is determined. The noise signal corresponds to a normal distribution and can be determined by computing the mean value and the standard deviation for a non-signal interval in the deviation spectrum. The non-signal interval may be any frequency interval in the deviation spectrum corresponding to a frequency interval having a normal distribution. The system may first select an interval where no signal peaks appear, and may then analyze whether the selected interval complies with the normal distribution criterion. If so, the noise value is computed. If not, another interval is selected and the same tests are performed until a mere noise interval (i.e., an interval without NMR signal components) is finally determined.

The computed noise value may then be multiplied with a predefined weighting factor. The weighting factor determines a threshold probability for values in the deviation spectrum which are lower than or equal to the weighted noise value to qualify as noise values with said threshold probability. For example, when using the standard deviation multiplied with a factor of 3.5 to compute the weighted noise value there is a 99 percent probability that all values below the weighted noise value actually represent noise components of the signal. The values in the deviation spectrum which are higher than the weighted noise value qualify as NMR signal components. Once the signal components are identified the respective signal intervals correspond to the frequency intervals in the deviation spectrum including the detected NMR signal components.

Optionally, the computer system may include a smoothening and phase correction module 150 to smoothen the basis line in the deviation spectrum and to perform a phase correction on the detected NMR signal intervals.

In another embodiment, the signal detector 140 generates an eigenspace matrix from the plurality of generated base value centered spectra 103-1 to 103-$n$ and determines the absolute values of at least the first eigenvector of the matrix. Such absolute values represent the system function induced variations. The eigenspace matrix can be constructed by including a row for each base value centered spectrum where each column includes the spectrum values for the respective frequency points. The relevant eigenvalues are determined by a threshold. For example, a relative threshold of a value of $10^{-5}$ may be used, e.g., all eigenvalues above maximum eigenvalue times the relative threshold are used. Then the absolute values of the corresponding eigenvectors, multiplied with their eigenvalues are used. If more than one eigenvector result is used, the resulting eigenvectors are summed up. In some cases, the absolute values of the first eigenvector of the matrix may already be sufficient and no summation is required. The eigenvector result is similar to the deviation spectrum where the absolute values of the at least first eigenvector (or the respective sum of eigenvectors) represent the system function induced variations.

Based on the eigenvector result, weighted noise values can be determined by using the same methodologies as disclosed in the deviation spectrum embodiment. The absolute values of the eigenvector result are then compared with the respective weighted noise values and NMR signal components are identified for such frequency points where the absolute values are greater than the weighted noise values.

In a further alternative embodiment, the signal detector 140 uses iterative thresholding when extracting the variation for each frequency point from the base value centered spectra 103-1 to 103-$n$ to detect the NMR signal intervals. An initial threshold value is determined by computing the standard deviation of the respective spectrum and multiplying the standard deviation with a predefined factor. The predefined factor is called noise factor. Again, the basic assumption here is that noise follows a Gaussian normal distribution. The noise factor represents the confidence interval. In a next step a new standard deviation is determined based on all points of the spectrum which are smaller than the initial threshold. A new threshold is then computed based on the new standard deviation and the noise factor. This process is then iterated until the new standard deviation differs from the previously calculated standard deviation in less than a predefined delta value. Based on the last determined standard deviation the remaining steps of the first signal detector embodiment can be applied to finally detect the signal intervals.

In the following, additional embodiments are described based on the first signal detector embodiment. However, a person skilled in the art can easily transfer the disclosed teachings to also implement alternative single detector embodiments.

Figure 3A:
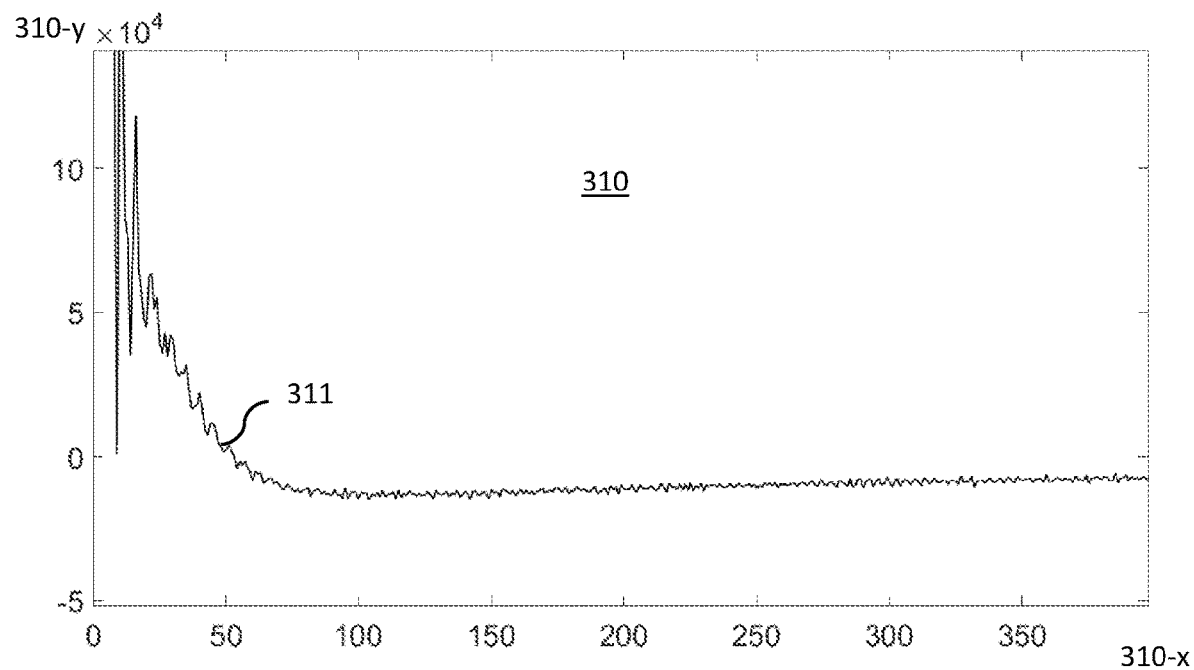
FIGS. 3A, 3B show examples of NMR signal data in the time- and frequency domains.
Figure 3B:
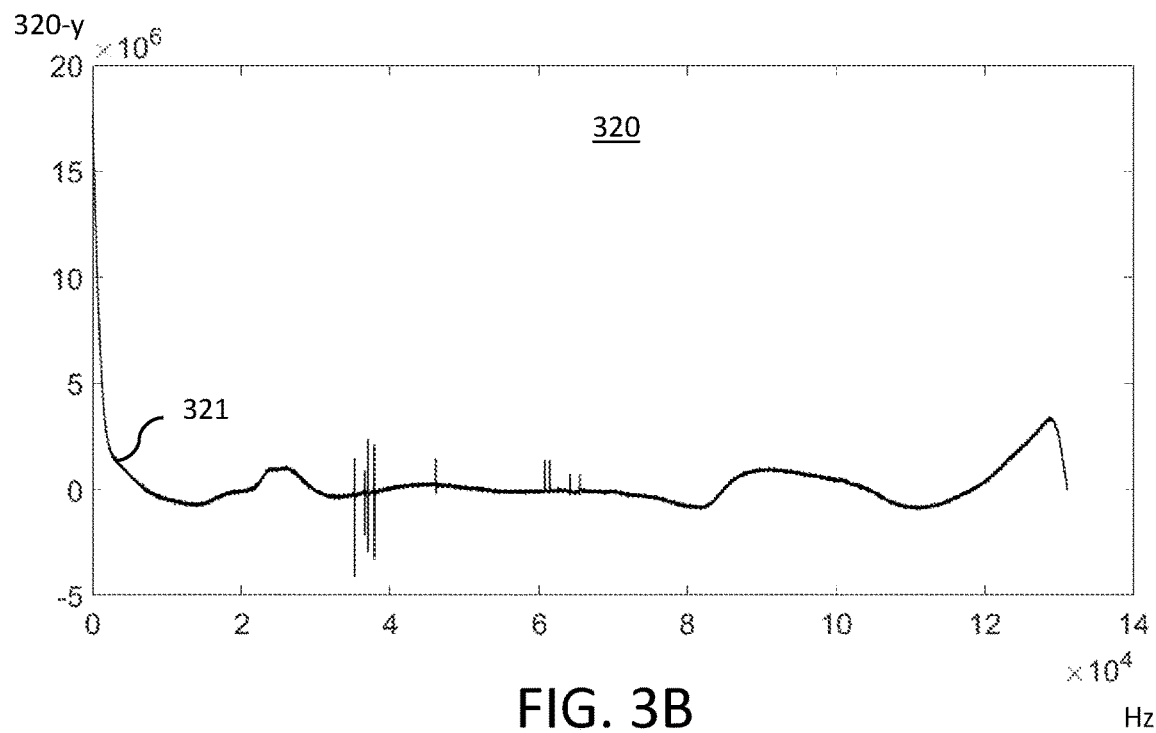

FIG. 3A illustrates received NMR signal data 311 in the time-domain. The time scale 310-$x$ of the signal graph 310 is in multiples of Dwell time (in this example 14 microseconds). The signal intensity is given in arbitrary units of the measurement. In NMR, the Dwell Time is defined as the number of seconds between points during data acquisition in the FID, which is the same as seconds/point. The figure shows a quick signal decay which occurs after the excitation of the sample with the excitation pulse. FIG. 3B shows the real part 321 of the NMR signal data 311 when transformed into a frequency spectrum 320 after a Fourier Transformation of the time signal 311. The imaginary part of the frequency spectrum is not shown here but would also be needed to transform the NMR signal data in the frequency-domain back into the time domain using inverse Fourier Transformation. Both domain representations of the received NMR signal data may be used as an input for the IDS generator.

Figure 4A:
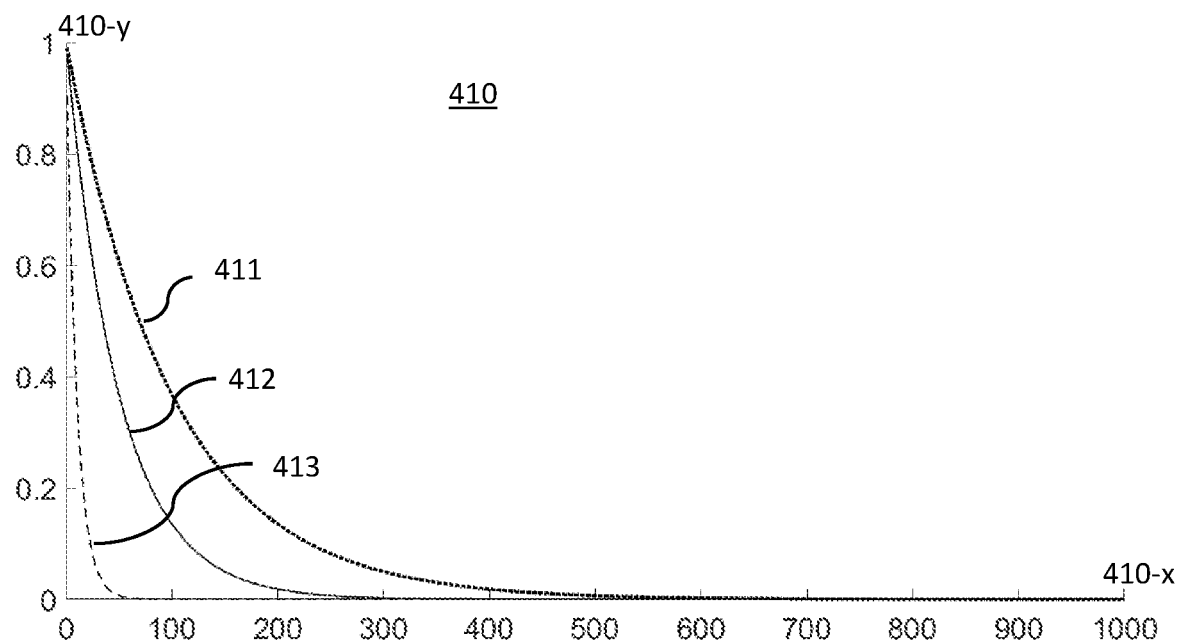
FIG. 4A illustrates an example of a system function in the time-domain.

The IDS generator then applies a predefined system function to the received NMR signal data in accordance with the respective domain. Examples of appropriate system functions were discussed already above. In the following example, the system function $f(t)=e^{-LB^* \pi^* DW^* t}$ is used. Such an exponential function has proven to be computationally efficient for application in the time-domain. In the example system function f(t), DW corresponds to the Dwell time (the distance between two data points in the time-domain). The parameter LB corresponds to the variation parameter of the system function and has Hz as the unit of measurement with the advantage that it can easily be adjusted for different Larmor frequencies (e.g., $^1H$, $^{13}C$, $^{15}N$). Different VP parameter values affect the signal width (in the frequency-domain) so that multiplying the received NMR signal data with the parameterized system functions leads to different intermediate data sets where each intermediate data set associated with a particular VP value shows different peak width and peak height values for a respective signal peak of the original NMRS signal data. Advantageously, the variation of the variation parameter values is in a range which covers the peak widths of all NMR signal peaks in the frequency-domain. FIG. 4A illustrates the system function f(t) in the time-domain 410 (time axis 410-$x$) for three different VP values (in the example: 1 Hz, 10 Hz, and 20 Hz) resulting in three instances 411, 412, 413 of the system function f(t). In this figure and in the following spectrum figures, the unit of the x-axis of a graph nnn is referred to as nnn-x and the unit of the y-axis of said graph is referred to as nnn-y.

Figure 4B:
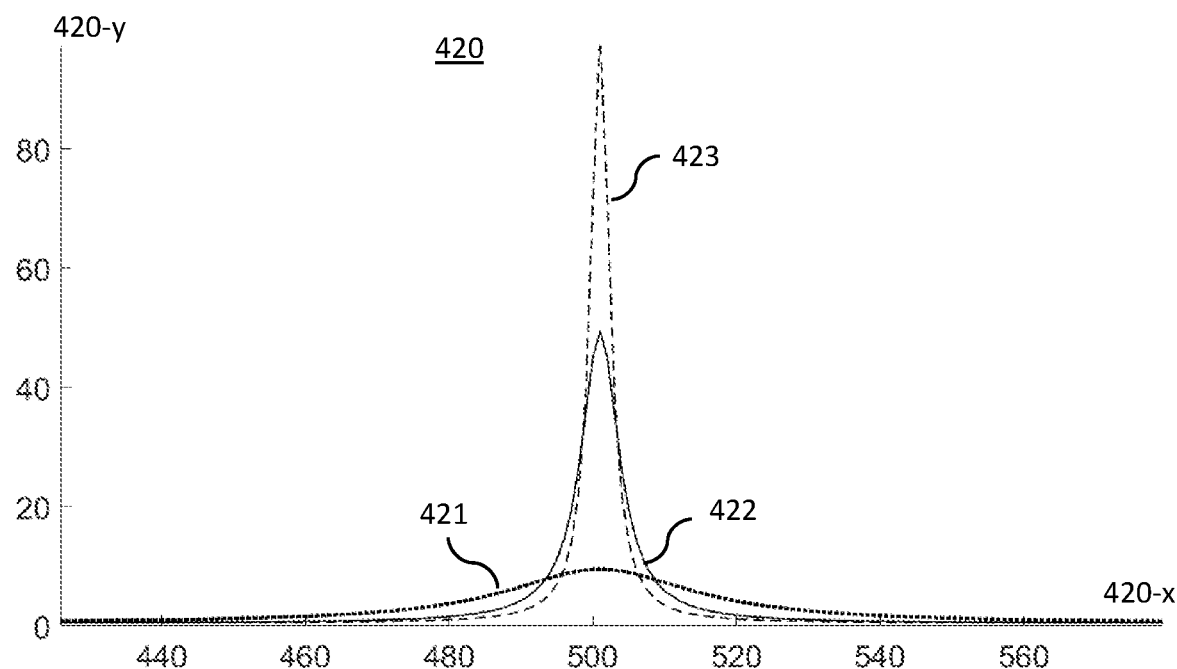
FIG. 4B illustrates an example of a system function in the frequency-domain.

FIG. 4B illustrates an example of a system function 420 in the frequency-domain (x-axis 420-x in Hz) which can be used for a convolution with received NMR signal data in the frequency domain. Again, three different VP values lead to three different instances 421, 422, 423 of the system function.

Figure 5A:
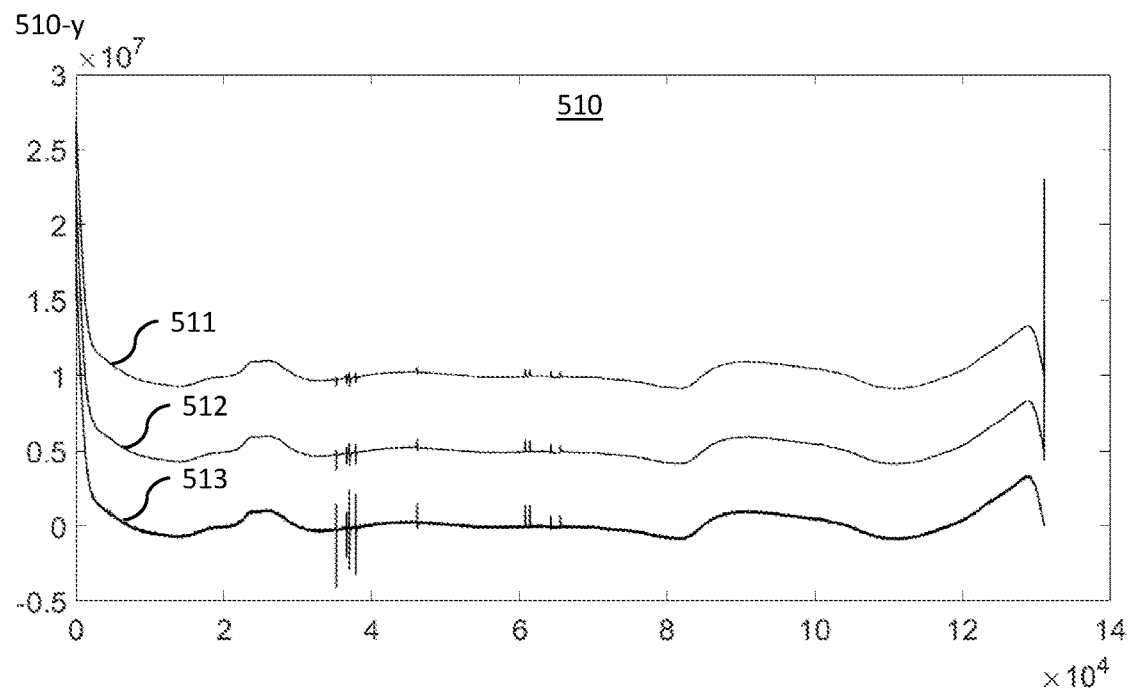
FIGS. 5A, 5B, 5C show intermediate data sets as result of the application of a system function to NMR signal data with different VP values.

FIG. 5A shows three intermediate data sets 501, 502, 503 as the result of the application of said system function to the NMR signal data with three different VP values. The example graph 510 shows the intermediate data sets in the frequency-domain with the unit 510-x (Points, distance between points is dwell time DW). The intensity 510-y has arbitrary units from the measurement. In the example, the influence of the applied system function on the signal height is increasing from intermediate data set 501 to intermediate data set 503 (i.e., the respective peak heights are increasing). This example shows how the application of the system functions with different VP values generates a plurality of intermediate data sets with a substantial variation in such parts of the NMR signal spectrum which includes NMR signal components whereas such parts including only noise components are hardly affected by the variation.

Figure 5B:
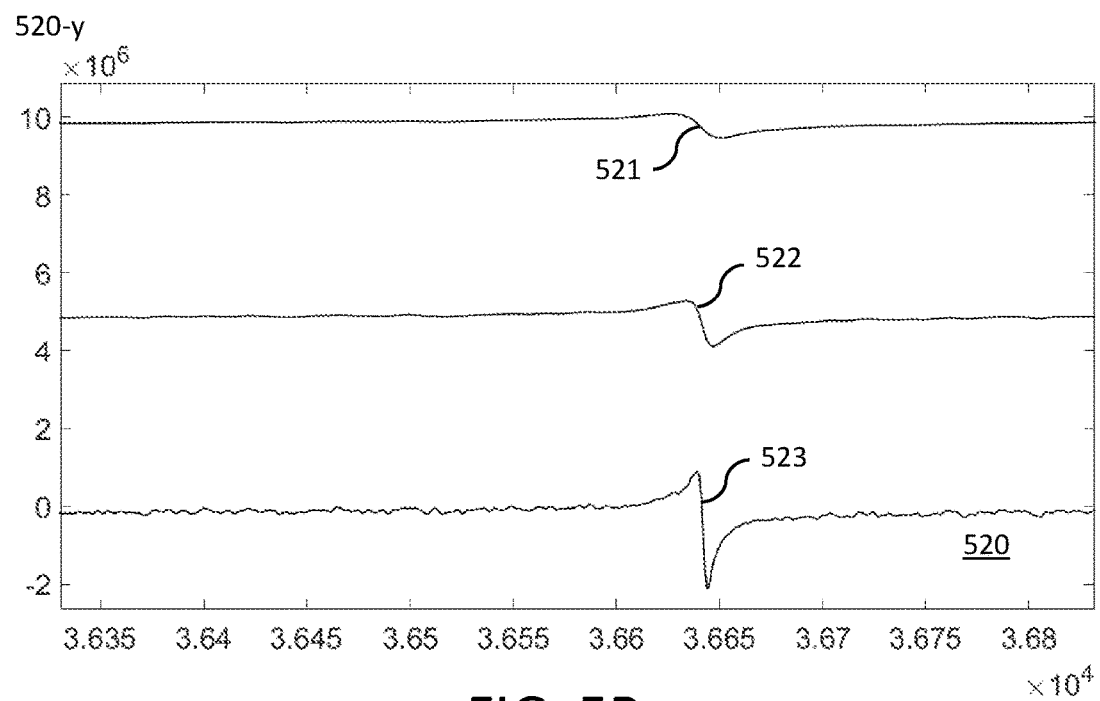
Figure 5C:
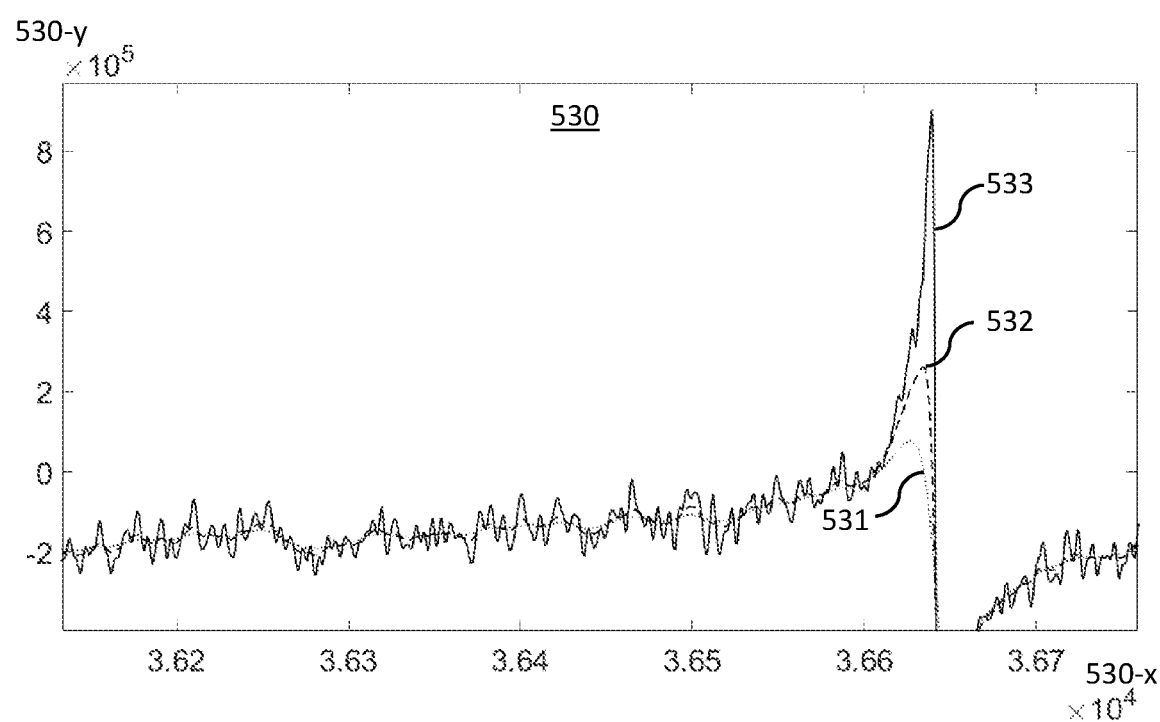

FIG. 5B shows a more detailed view 520 of intermediate data sets 521 to 523 focusing on only a small portion in the frequency dimension 520-x where only a single NMR signal peak was included. The shape of the signal peak is substantially affected by the system function for three different VP values leading to substantial differing variations of the original NMR signal for differing VP values. FIG. 5C shows an overlay graph 530 where the intermediate data sets of FIG. 5B are printed as overlays at substantially the same y values in the 530-y dimension. The overlay graph clearly visualizes the variations of the respective signal peak in the intermediate data sets 531 to 533. The position of the peak in the frequency dimension 530-x corresponds to the position in FIG. 5B.

Figure 6A:
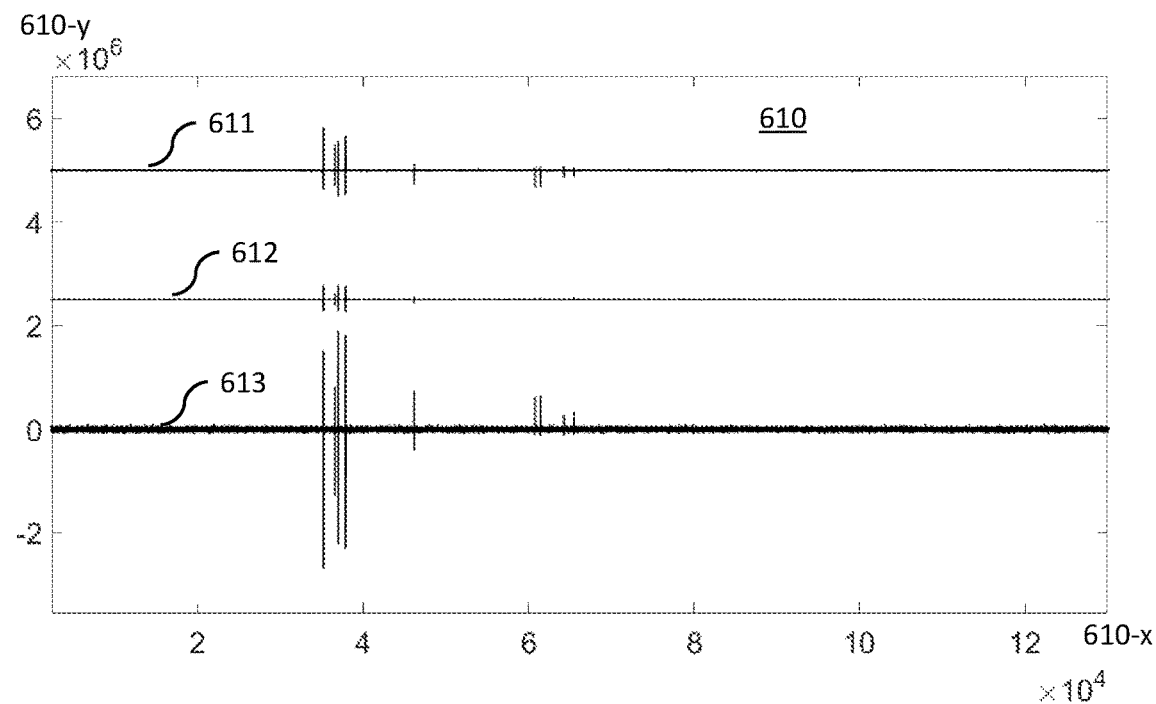
FIGS. 6A, 6B, 6C, 6D show base value centered spectra computed based on the intermediate data sets.
Figure 6B:
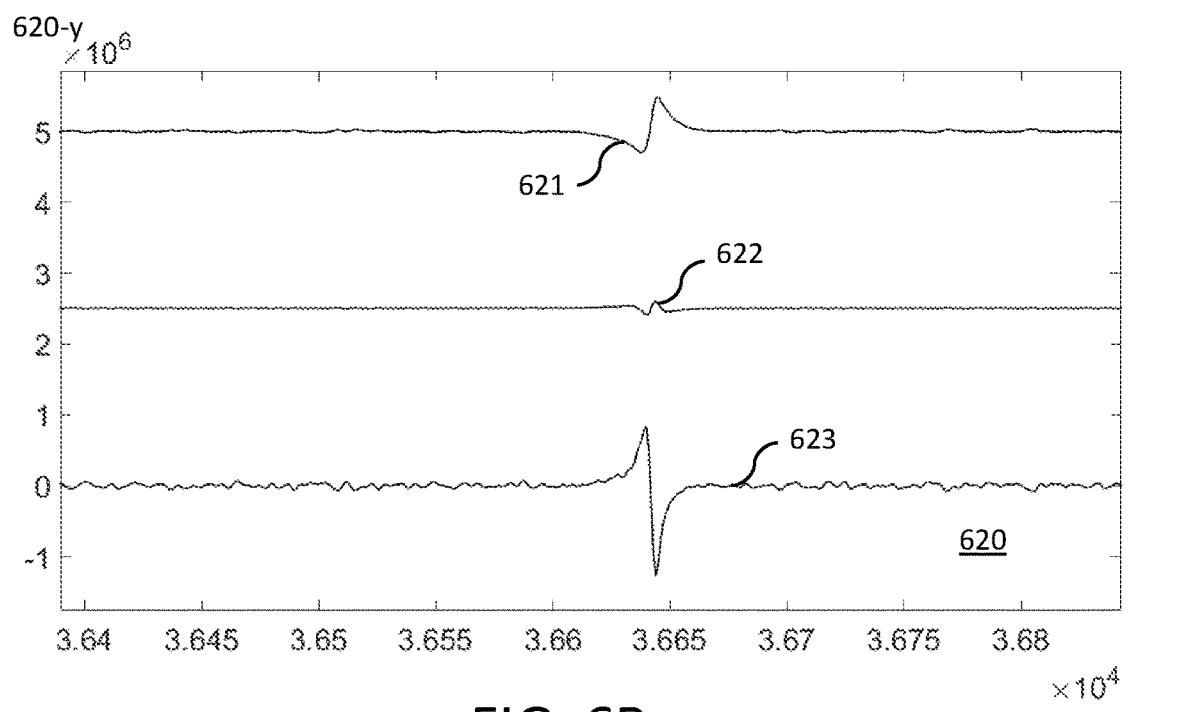

The intermediate data sets (e.g., 511 to 513 of FIG. 5A) serve as input to the BVCS generator for generating respective base value centered spectra 611 to 613. The base value centered spectra in the BVCS graph 610 of FIG. 6A show the result of processing the intermediate data sets for eliminating offsets in such a way that the result leads to curves which are horizontally aligned around zero, removing the local base values. Thereby, the base values are an approximation of the actual offsets of the respective curve. The BVCS spectra are always determined in the frequency-domain. For example, the BVCS generator can compute the BVCS spectra by determining a mean value for each frequency point based on all intermediated data sets. That is, in the example only 3 VP values were used which leads to three intermediate data sets. For each frequency point of the intermediate data sets the corresponding spectrum value is used to compute a mean value across all intermediate data sets. In a real signal detection scenario the number of intermediate data sets can be higher but advantageously does not exceed 20. The mean value can be computed as average value (e.g., arithmetic average or other averages) or it can be computed by using appropriate statistical methods, such as for example, determining the median. The computed mean values for all frequency points are then subtracted from the respective spectrum values of the intermediate data sets leading to the BVCS 611 to 613. FIG. 6B shows another BVCS graph 620 with a more detailed view on a frequency interval of the spectra including a single peak located close to the frequency 36650 620-x.

Figure 6C:
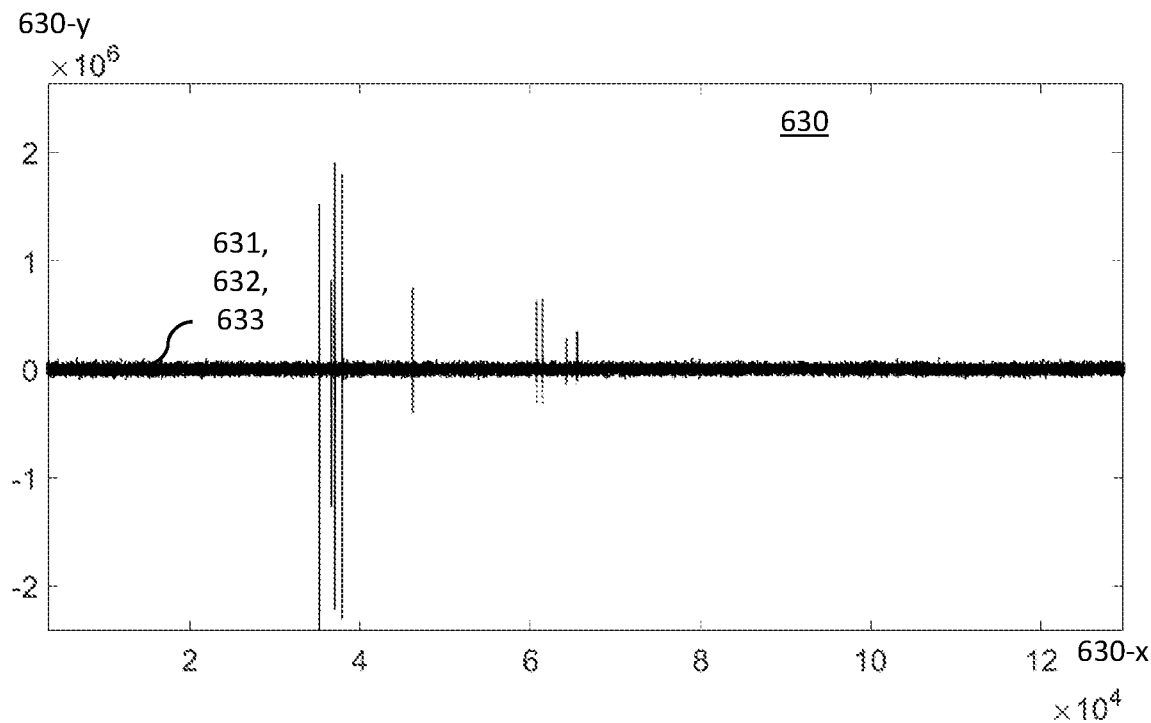
Figure 6D:
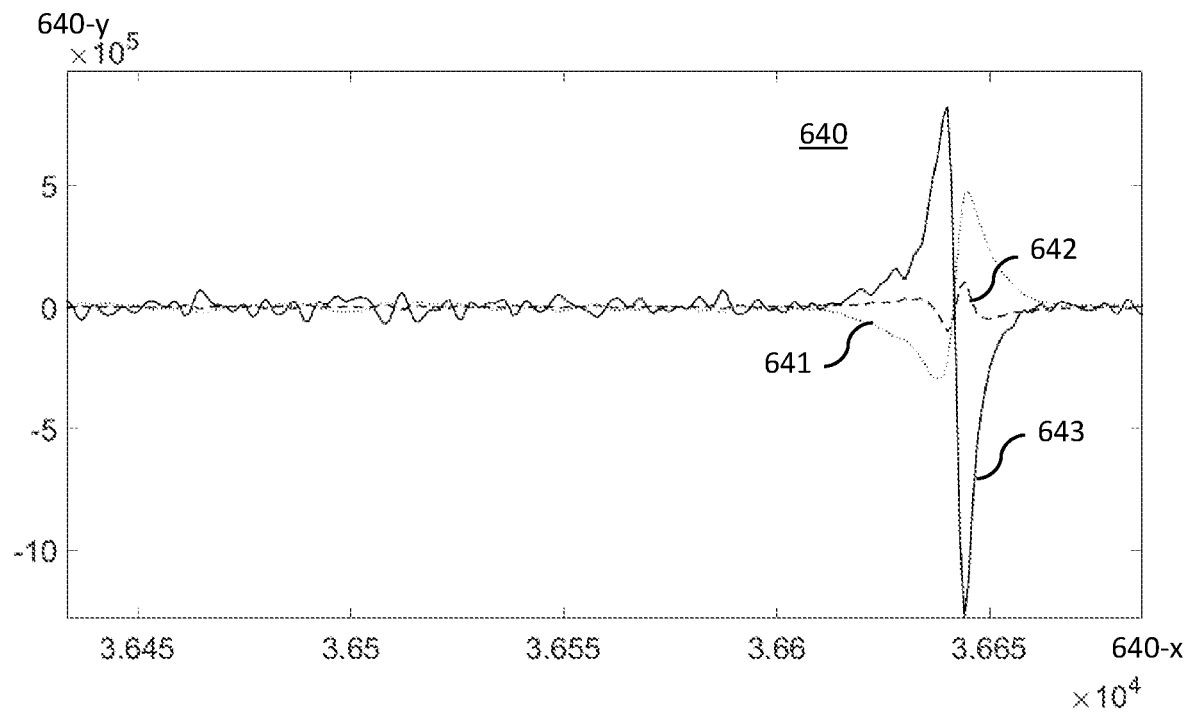

FIG. 6C shows the base value centered spectra 631 to 633 as an overlay graph 630 corrected by the offsets approximated by the determined base values. As a result, all BVCS are now centered around zero in the 630-y dimension. FIG. 6D again shows a detailed overlay view 640 of a frequency range including a single peak for three BVCS 641, 642, 643 associated with three different VP values.

Figure 7A:
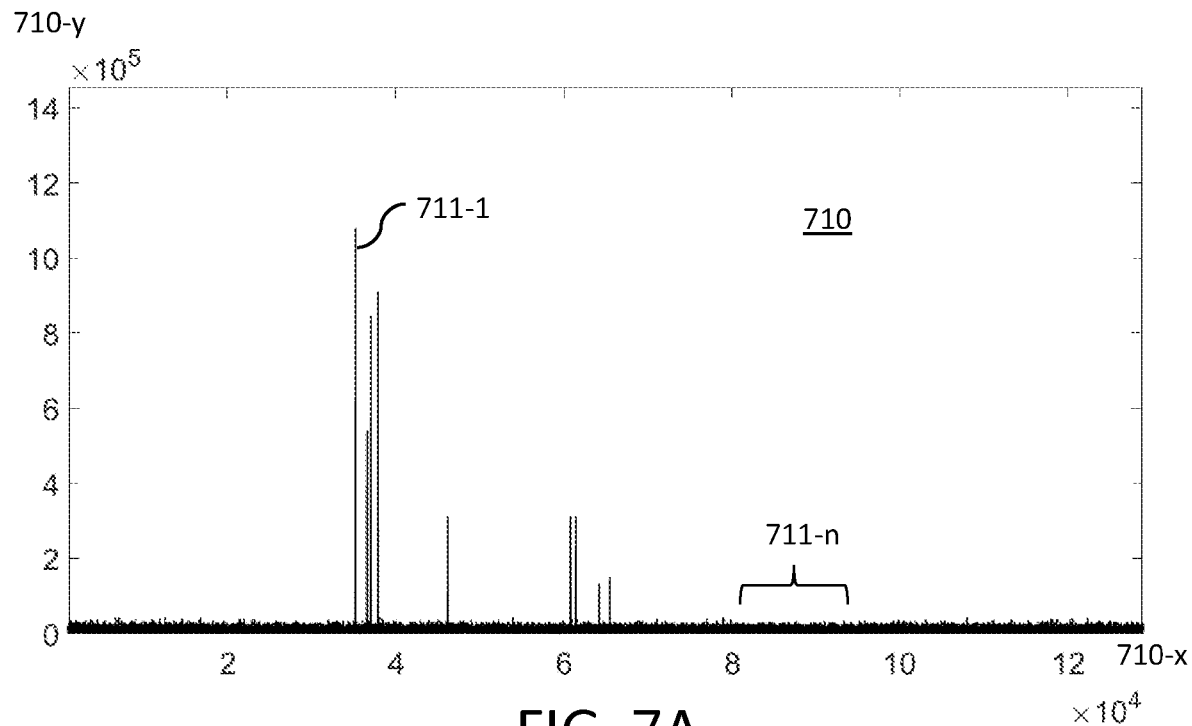
FIGS. 7A and 7B relate to an embodiment using a deviation spectrum for extracting variations induced by a system function from base value centered spectra.
Figure 7B:
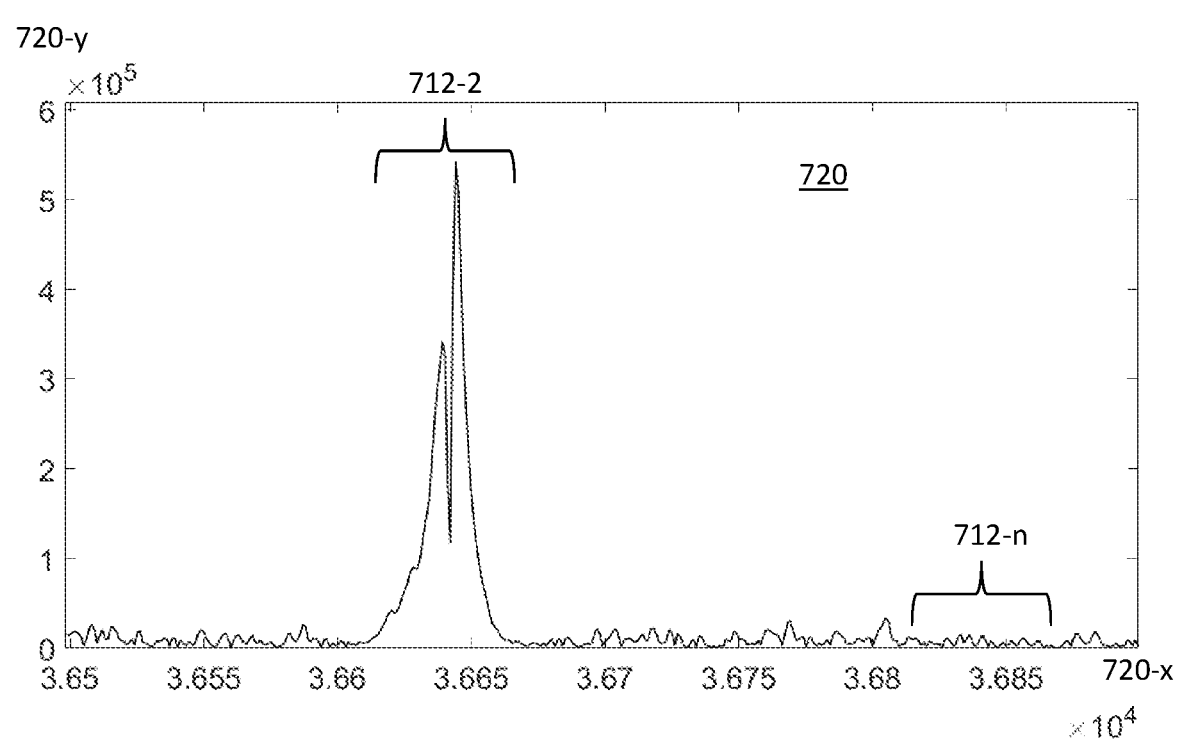

FIGS. 7A and 7B relate to the embodiment using a deviation spectrum 710, 720 for extracting variations induced by the system function from the base value centered spectra for each frequency point. In FIG. 7A, the deviation spectrum 710 is shown for the entire frequency range of the respective base value centered spectra. The peak 711-1 indicates a first frequency interval with a high variation (significant variation peak) which is an indicator for the presence on NMR signal components in the first frequency interval. A second frequency range at 711-n shows substantially no variation at all which is an indicator that within the second frequency interval only noise components are present but no NMR signal components.

FIG. 7B shows a detailed view of the deviation spectrum 720 over a portion of the frequency range with a variation double peak in frequency interval 712-2 and substantially no variation in frequency interval 712-n. Based on the deviation spectrum 720 (or 710) the system can determine a noise value. A noise signal follows a Gaussian normal distribution. The system can select any of the frequency intervals showing substantially no variation (e.g., frequency intervals 711-n, 712-n) and computing the mean value and the standard deviation for this (non-signal) interval in the deviation spectrum. If the standard deviation follows a normal distribution a frequency interval is identified which has no NMR signal components but only noise components. The computed noise value can then be multiplied with a predefined weighting factor. The weighting factor determines a threshold probability for values in the deviation spectrum which are lower than or equal to the weighted noise value to qualify as noise values with said threshold probability. The noise factor can be chosen in the range of the half width of the Gaussian curve. Advantageously, the factor is 3.5 covering 99 percent of the peak integral. In other words, multiplying the standard deviation with a factor of 3.5 can be used to achieve a probability of 0.99 that all values of the deviation spectrum which have a value lower than then weighted noise value actually represent noise.

Figure 8A:
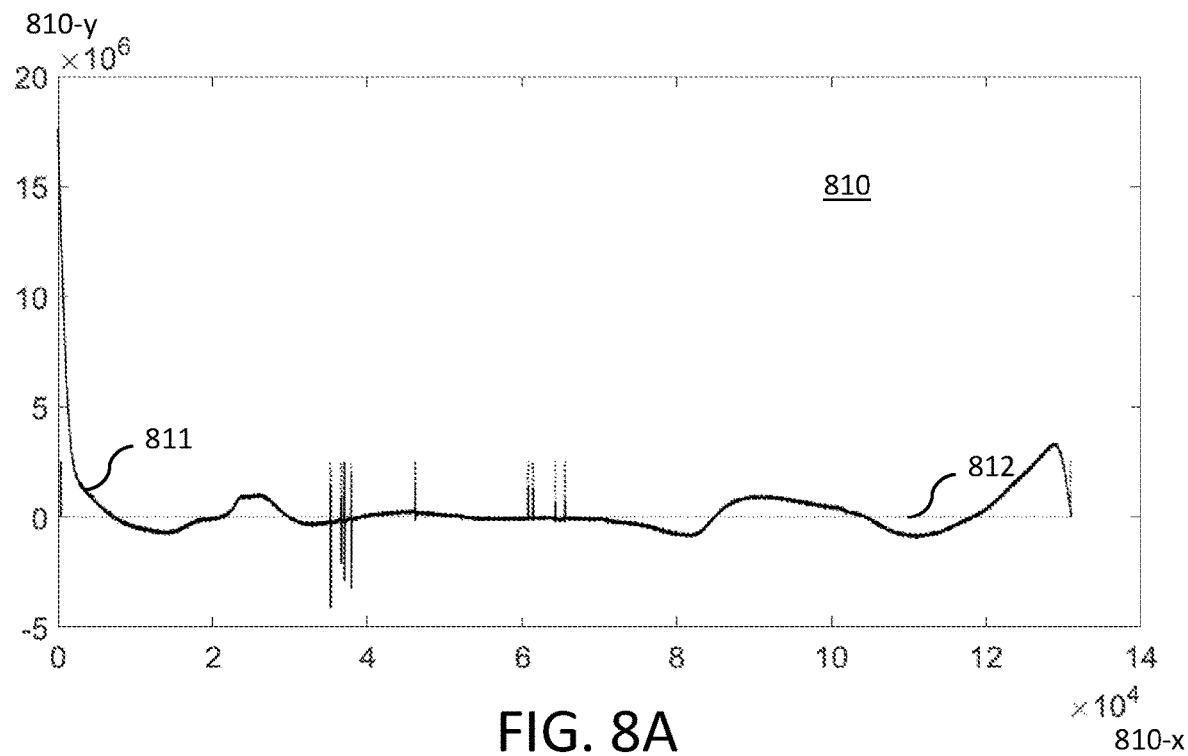
FIGS. 8A, 8B shows signal interval graphs with original NMR signal data and an overlay curve indicating signal intervals according to an embodiment.
Figure 8B:
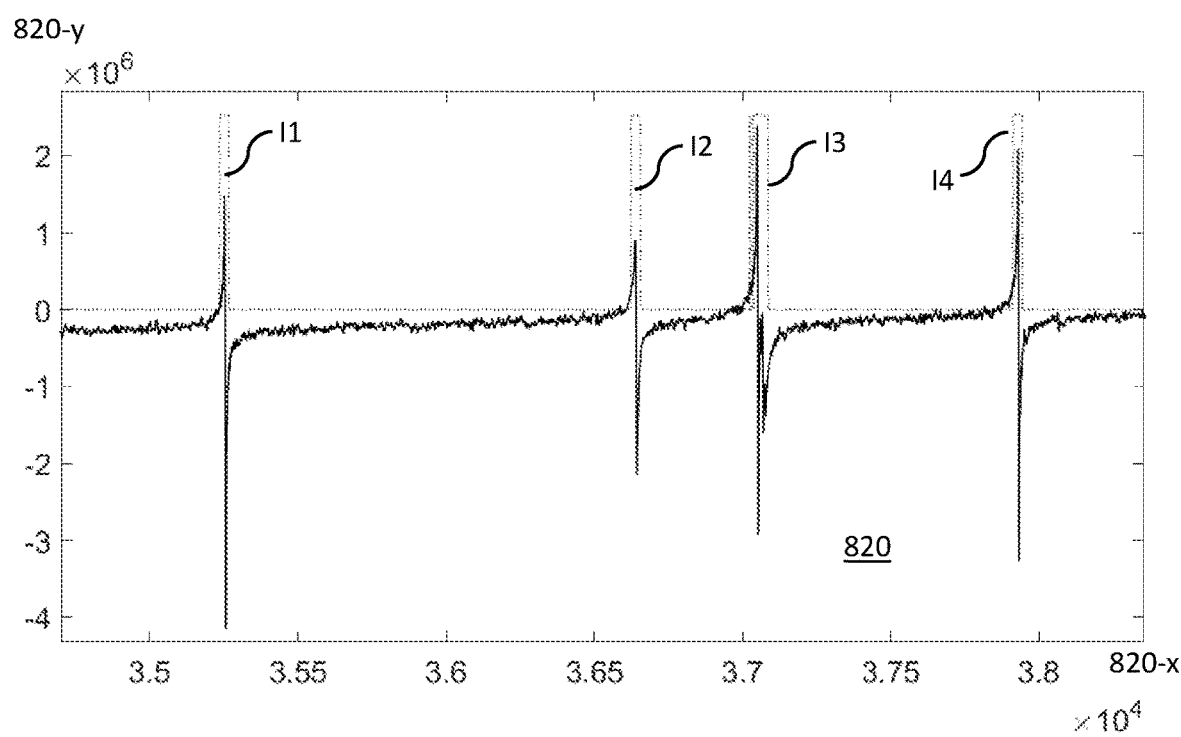

Once the weighted noise value is determined the values in the deviation spectrum which are higher than the weighted noise value are identified as NMR signal components. This allows to detect, in the deviation spectrum, the frequency intervals where NMR signal components are present. The detected NMR signal frequency intervals are then used in the original NMR signal data (in the frequency-domain, or in the time-domain after an inverse Fourier Transformation) to filter out the noise parts of the spectrum. FIG. 8A shows a signal interval graph 810 with the original NMR signal data 811 and an overlay curve 812 (dotted line) indicating the signal intervals. However, when looking at the entire frequency range of FIG. 8A the signal intervals cannot be resolved by the human eye in graph 810. Therefore, FIG. 8B again shows a detailed view 820 for a part of the frequency range including the four signal intervals I1, I2, I3 and I4.

The identified signal intervals (e.g., I1, I2, I3 and I4) allow robust NMR signal detection with higher accuracy than prior art solutions for signal detection. On the basis of the identified signals highly precise NMR analysis becomes possible.

The embodiment illustrated in the detailed description focuses on the standard deviation method. A person skilled in the art will acknowledge that the previously described alternative embodiments based on iterative thresholding or based on the eigenvector method lead to similar robust and accurate detection of NMR signal intervals and therefore also provide a robust technical solution for the technical problem to provide an improved NMR signal detection method.

Figure 9:
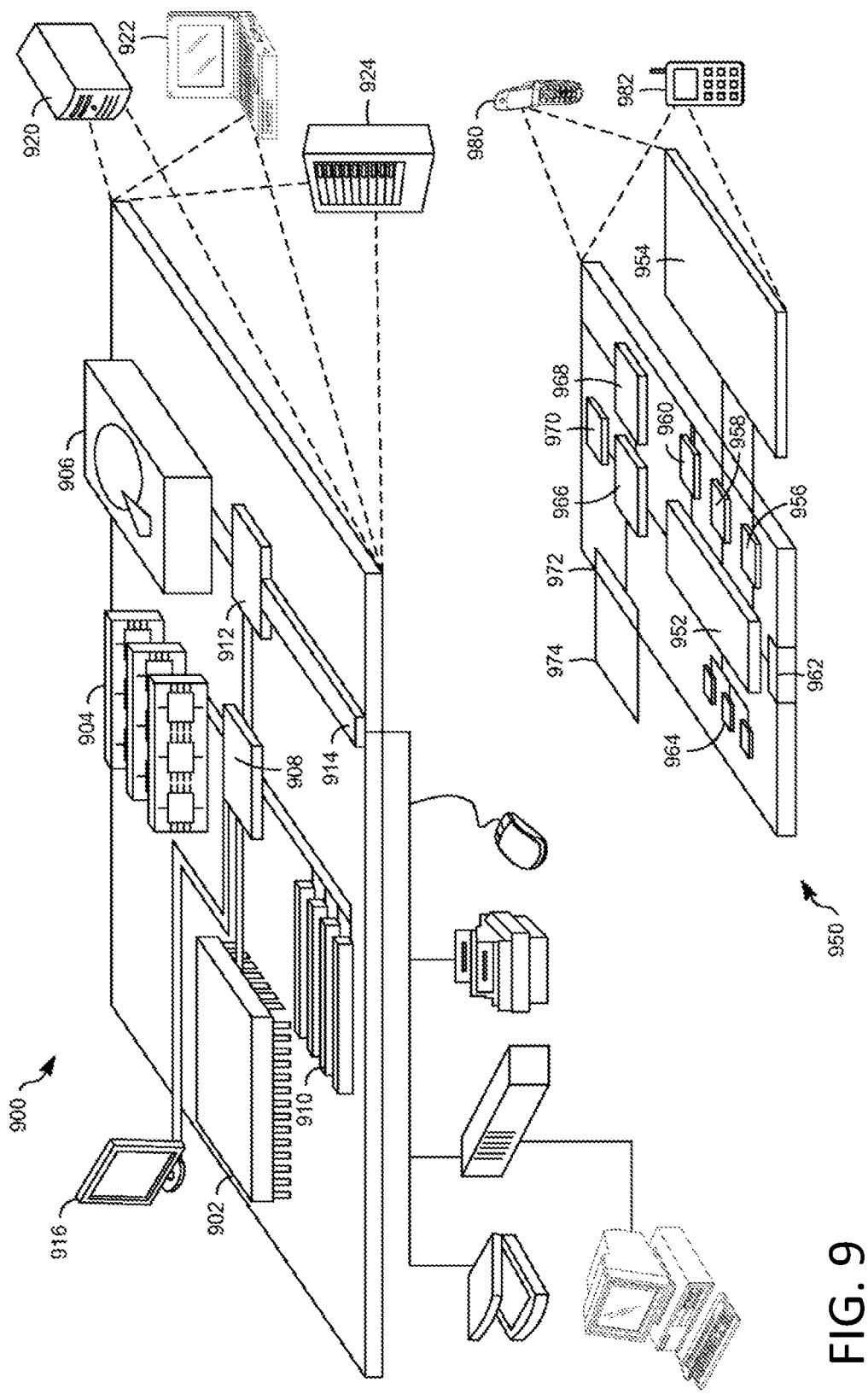
FIG. 9 is a diagram that shows an example of a generic computer device and a generic mobile computer device which may be used with the techniques described herein.

FIG. 9 is a diagram that shows an example of a generic computer device 900 and a generic mobile computer device 950, which may be used with the techniques described here. In some embodiments, computing device 900 may relate to the system 100 (cf. FIG. 1). Computing device 950 is intended to represent various forms of mobile devices, such as personal digital assistants, cellular telephones, smart phones, and other similar computing devices. In the context of this disclosure the computing device 950 may provide the I/O means of FIG. 1. In other embodiments, the entire system 100 may be implemented on the mobile device 950. The components shown here, their connections and relationships, and their functions, are meant to be exemplary only, and are not meant to limit implementations of the subject matter described and/or claimed in this document.

Computing device 900 includes a processor 902, memory 904, a storage device 906, a high-speed interface 908 connecting to memory 904 and high-speed expansion ports 910, and a low speed interface 912 connecting to low speed bus 914 and storage device 906. Each of the components 902, 904, 906, 908, 910, and 912, are interconnected using various busses, and may be mounted on a common motherboard or in other manners as appropriate. The processor 902 can process instructions for execution within the computing device 900, including instructions stored in the memory 904 or on the storage device 906 to display graphical information for a GUI on an external input/output device, such as display 916 coupled to high speed interface 908. In other implementations, multiple processors and/or multiple buses may be used, as appropriate, along with multiple memories and types of memory. Also, multiple computing devices 900 may be connected, with each device providing portions of the necessary operations (e.g., as a server bank, a group of blade servers, or a multi-processor system).

The memory 904 stores information within the computing device 900. In one implementation, the memory 904 is a volatile memory unit or units. In another implementation, the memory 904 is a non-volatile memory unit or units. The memory 904 may also be another form of computer-readable medium, such as a magnetic or optical disk.

The storage device 906 is capable of providing mass storage for the computing device 900. In one implementation, the storage device 906 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 904, the storage device 906, or memory on processor 902.

The high speed controller 908 manages bandwidth-intensive operations for the computing device 900, while the low speed controller 912 manages lower bandwidth-intensive operations. Such allocation of functions is exemplary only.

In one implementation, the high-speed controller 908 is coupled to memory 904, display 916 (e.g., through a graphics processor or accelerator), and to high-speed expansion ports 910, which may accept various expansion cards (not shown). In the implementation, low-speed controller 912 is coupled to storage device 906 and low-speed expansion port 914. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 900 may be implemented in a number of different forms, as shown in the figure. For example, it may be implemented as a standard server 920, or multiple times in a group of such servers. It may also be implemented as part of a rack server system 924. In addition, it may be implemented in a personal computer such as a laptop computer 922. Alternatively, components from computing device 900 may be combined with other components in a mobile device (not shown), such as device 950. Each of such devices may contain one or more of computing device 900, 950, and an entire system may be made up of multiple computing devices 900, 950 communicating with each other.

Computing device 950 includes a processor 952, memory 964, an input/output device such as a display 954, a communication interface 966, and a transceiver 968, among other components. The device 950 may also be provided with a storage device, such as a microdrive or other device, to provide additional storage. Each of the components 950, 952, 964, 954, 966, and 968, are interconnected using various buses, and several of the components may be mounted on a common motherboard or in other manners as appropriate.

The processor 952 can execute instructions within the computing device 950, including instructions stored in the memory 964. The processor may be implemented as a chipset of chips that include separate and multiple analog and digital processors. The processor may provide, for example, for coordination of the other components of the device 950, such as control of user interfaces, applications run by device 950, and wireless communication by device 950.

Processor 952 may communicate with a user through control interface 958 and display interface 956 coupled to a display 954. The display 954 may be, for example, a TFT LCD (Thin-Film-Transistor Liquid Crystal Display) or an OLED (Organic Light Emitting Diode) display, or other appropriate display technology. The display interface 956 may comprise appropriate circuitry for driving the display 954 to present graphical and other information to a user. The control interface 958 may receive commands from a user and convert them for submission to the processor 952. In addition, an external interface 962 may be provide in communication with processor 952, so as to enable near area communication of device 950 with other devices. External interface 962 may provide, for example, for wired communication in some implementations, or for wireless communication in other implementations, and multiple interfaces may also be used.

The memory 964 stores information within the computing device 950. The memory 964 can be implemented as one or more of a computer-readable medium or media, a volatile memory unit or units, or a non-volatile memory unit or units. Expansion memory 984 may also be provided and connected to device 950 through expansion interface 982, which may include, for example, a SIMM (Single In Line Memory Module) card interface. Such expansion memory 984 may provide extra storage space for device 950, or may also store applications or other information for device 950. Specifically, expansion memory 984 may include instructions to carry out or supplement the processes described above, and may include secure information also. Thus, for example, expansion memory 984 may act as a security module for device 950, and may be programmed with instructions that permit secure use of device 950. In addition, secure applications may be provided via the SIMM cards, along with additional information, such as placing the identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 964, expansion memory 984, or memory on processor 952, that may be received, for example, over transceiver 968 or external interface 962.

Device 950 may communicate wirelessly through communication interface 966, which may include digital signal processing circuitry where necessary. Communication interface 966 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 968. In addition, short-range communication may occur, such as using a Bluetooth, WiFi, or other such transceiver (not shown). In addition, GPS (Global Positioning System) receiver module 980 may provide additional navigation- and location-related wireless data to device 950, which may be used as appropriate by applications running on device 950.

Device 950 may also communicate audibly using audio codec 960, which may receive spoken information from a user and convert it to usable digital information. Audio codec 960 may likewise generate audible sound for a user, such as through a speaker, e.g., in a handset of device 950. Such sound may include sound from voice telephone calls, may include recorded sound (e.g., voice messages, music files, etc.) and may also include sound generated by applications operating on device 950.

The computing device 950 may be implemented in a number of different forms, as shown in the figure. For example, it may be implemented as a cellular telephone 980. It may also be implemented as part of a smart phone 982, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing device that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network ("LAN"), a wide area network ("WAN"), and the Internet.

The computing device can include clients and servers. A client and server are generally remote from each other and typically interact through a communication network. The relationship of client and server arises by virtue of computer programs running on the respective computers and having a client-server relationship to each other.

What is claimed is:

1. A computer-implemented spectroscopic method for improved NMR signal detection, comprising:
   receiving NMR signal data produced by a sample over time in response to an excitation pulse;
   selecting a predefined system function for application to the NMR signal data for systematic variation of signal properties wherein the system function has a different influence on NMR signal components than on noise components of the sampled signal, the system function having a variation parameter to control the systematic variation;
   providing a plurality of variation parameter values wherein the selected parameter values have differing values which are adapted for influencing, in the frequency-domain, NMR signals with a signal intensity within a given interval around the mean signal intensity of the sampled signal, and NMR signals with a signal width within a given interval around the mean signal width;

generating for each variation parameter value a corresponding intermediate data set by applying the system function with the respective variation parameter value to the NMR signal data;

generating from each intermediate data set a respective base value centered spectrum in the frequency-domain wherein the respective base value centered spectra eliminate offsets from the intermediate data sets including approximating corresponding base values representing the actual offsets, wherein generating base value centered spectra further comprises:

computing for each point of the intermediate data sets in the frequency-domain an ensemble base value based on the respective values of all intermediate data sets;

subtracting the computed ensemble base values from the respective values of the intermediate data sets resulting in a corresponding base value centered spectrum for each intermediate data set; and detecting signal intervals by extracting from the base value centered spectra for each frequency point variations induced by the system function and identifying frequency intervals with significant variation as signal intervals.

2. The method of claim 1, wherein the variation parameter has Hertz as the unit of measurement and the number of variation parameter values is in the range from 3 to 20.

3. The method of claim 1, wherein the selected system function is selected from the group of: exponential decay function, exponential slope function, or trigonometric function, multiplied with the NMR signal data if the signal data is in the time-domain, and Lorentz function, Gaussian function, or Trapezium Function, used in a convolution with the NMR signal data if the signal data is in the frequency-domain.

4. The method of claim 1, wherein detecting signal intervals comprises:

generating a deviation spectrum from the plurality of generated base value centered spectra;

determining a noise value with the noise signal corresponding to a normal distribution by computing the mean value and the standard deviation for a non-signal interval in the deviation spectrum, the non-signal interval corresponding to a frequency interval having a normal distribution;

multiplying the computed standard deviation with a predefined weighting factor wherein the weighting factor determines a threshold probability for values in the deviation spectrum which are lower than or equal to the weighted noise value to qualify as noise values with said threshold probability; and determining values in the deviation spectrum which are higher than the weighted noise value as NMR signal components.

5. The method of claim 1, wherein detecting signal intervals comprises:

generating an eigenspace matrix from the plurality of generated base value centered spectra;

determining the absolute values of at least the first eigenvector of the matrix, the absolute values representing the system function induced variations; and identifying the absolute values which are greater than respective weighted noise values as NMR signal components.

6. The method of claim 1, wherein detecting signal intervals is performed by using iterative thresholding when extracting the variation for each frequency point from the base value centered spectra.

7. The method of claim 1, further comprising:
smoothening of the basis line in the original frequency spectrum and performing a phase correction.

8. The method of claim 1, wherein the provided variation parameter values are of the order of the half-width of signal peaks in the frequency-domain of the sampled NMR signal data.

9. A computer program product that when loaded into a memory of a computing device and executed by at least one processor of the computing device executes the steps of:

receiving NMR signal data produced by a sample over time in response to an excitation pulse;

selecting a predefined system function for application to the NMR signal data for systematic variation of signal properties wherein the system function has a different influence on NMR signal components than on noise components of the sampled signal, the system function having a variation parameter to control the systematic variation;

providing a plurality of variation parameter values wherein the selected parameter values have differing values which are adapted for influencing, in the frequency-domain, NMR signals with a signal intensity within a given interval around the mean signal intensity of the sampled signal, and NMR signals with a signal width within a given interval around the mean signal width;

generating for each variation parameter value a corresponding intermediate data set by applying the system function with the respective variation parameter value to the NMR signal data;

generating from each intermediate data set a respective base value centered spectrum in the frequency-domain wherein the respective base value centered spectra eliminate offsets from the intermediate data sets including approximating corresponding base values representing the actual offsets, wherein generating base value centered spectra further comprises:

computing for each point of the intermediate data sets in the frequency-domain an ensemble base value based on the respective values of all intermediate data sets;

subtracting the computed ensemble base values from the respective values of the intermediate data sets resulting in a corresponding base value centered spectrum for each intermediate data set; and detecting signal intervals by extracting from the base value centered spectra for each frequency point variations induced by the system function and identifying frequency intervals with significant variation as signal intervals.

10. The computer program product of claim 9, wherein the variation parameter has Hertz as the unit of measurement and the number of variation parameter values is in the range from 3 to 20.

11. The computer program product of claim 9, wherein the selected system function is selected from the group consisting of: exponential decay function, exponential slope function, or trigonometric function, multiplied with the NMR signal data if the signal data is in the time-domain, and Lorentz function, Gaussian function, and Trapezium Function, used in a convolution with the NMR signal data if the signal data is in the frequency-domain.

12. The computer program product of claim 9, wherein detecting signal intervals comprises:
  generating a deviation spectrum from the plurality of generated base value centered spectra;
  determining a noise value with the noise signal corresponding to a normal distribution by computing the mean value and the standard deviation for a non-signal interval in the deviation spectrum, the non-signal interval corresponding to a frequency interval having a normal distribution;
  multiplying the computed standard deviation with a predefined weighting factor wherein the weighting factor determines a threshold probability for values in the deviation spectrum which are lower than or equal to the weighted noise value to qualify as noise values with said threshold probability; and
  determining values in the deviation spectrum which are higher than the weighted noise value as NMR signal components.

13. The computer program product of claim 9, wherein detecting signal intervals comprises:
  generating an eigenspace matrix from the plurality of generated base value centered spectra;
  determining the absolute values of at least the first eigenvector of the matrix, the absolute values representing the system function induced variations; and
  identifying the absolute values which are greater than respective weighted noise values as NMR signal components.

14. The computer program product of claim 9, wherein detecting signal intervals is performed by using iterative thresholding when extracting the variation for each frequency point from the base value centered spectra.

15. The computer program product of claim 9, wherein the provided variation parameter values are of the order of the half-width of signal peaks in the frequency-domain of the sampled NMR signal data.

16. A computer system for improved NMR signal detection in NMR spectroscopy, the system, comprising:
  an interface module configured to receive NMR signal data produced by a sample over time in response to an excitation pulse;
  an intermediate data set generator configured to:
    select a predefined system function for application to the NMR signal data for systematic variation of signal properties wherein the system function has a different influence on NMR signal components than on noise components of the sampled signal, the system function having a variation parameter to control the systematic variation;
    provide a plurality of variation parameter values wherein the selected parameter values have differing values which are adapted for influencing, in the frequency-domain, NMR signals with a signal intensity within a given interval around the mean signal intensity of the sampled signal, and NMR signals with a signal width within a given interval around the mean signal width;
    generate for each variation parameter value a corresponding intermediate data set by applying the system function with the respective variation parameter value to the sampled NMR signal data;
  a base value centered spectrum generator configured to:
    generate from each intermediate data set, in the frequency-domain, a respective base value centered spectrum wherein the respective base value centered spectra eliminate offsets from the intermediate data sets including approximating corresponding base values representing the actual offsets, by computing for each point of the intermediate data sets in the frequency-domain an ensemble base value based on the respective values of all intermediate data sets, and subtracting the computed ensemble base values from the respective values of the intermediate data sets resulting in a corresponding base value centered spectrum for each intermediate data set; and
  a signal detector configured to:
    detect signal intervals by extracting from the base value centered spectra for each frequency point variations induced by the system function, and to identify frequency intervals with significant variations as signal intervals.

17. The system of claim 16, wherein the signal detector is configured to:
  generate a deviation spectrum from the plurality of generated base value centered spectra;
  determine a noise value with the noise signal corresponding to a normal distribution by computing the mean value and the standard deviation for a non-signal interval in the deviation spectrum, the non-signal interval corresponding to a frequency interval having a normal distribution;
  multiply the computed noise value with a predefined weighting factor wherein the weighting factor determines a threshold probability for values in the deviation spectrum which are lower than or equal to the weighted noise value to qualify as noise values with said threshold probability; and
  determine values in the deviation spectrum which are higher than the weighted noise value as NMR signal components.

18. The system of claim 16, wherein the signal detector is configured to:
  generate an eigenspace matrix from the plurality of generated base value centered spectra;
  determine the absolute values of the product of the first m eigenvectors and eigenvalues of the matrix, the absolute values representing the system function induced variations; and
  identify the absolute values which are greater than respective weighted noise values as NMR signal components.

19. The system of claim 16, wherein the signal detector is configured to:
  detect signal intervals by using iterative thresholding when extracting the variation for each frequency point from the base value centered spectra.

20. A NMR spectrometer comprising the system of claim 16.

* * * * *